(12) United States Patent
Kurisu

(10) Patent No.: US 6,333,642 B1
(45) Date of Patent: Dec. 25, 2001

(54) LEVEL CONVERTING METHOD AND CIRCUIT HAVING AN INTERMEDIATE VOLTAGE LEVEL RANGE AND A CLAMPING CIRCUIT

(75) Inventor: Masakazu Kurisu, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/576,342

(22) Filed: May 22, 2000

(30) Foreign Application Priority Data

May 20, 1999  (JP) .................................................. 11-140858

(51) Int. Cl.[7] .............................................. H03K 19/175
(52) U.S. Cl. .................................. 326/73; 326/66; 326/63
(58) Field of Search ................................... 326/73, 74, 62, 326/63, 66, 67

(56) References Cited

U.S. PATENT DOCUMENTS

| | | | |
|---|---|---|---|
| 4,656,372 | * | 4/1987 | Sani et al. ............................ 307/475 |
| 4,704,549 | * | 11/1987 | Sanwo et al. ........................ 307/475 |
| 4,890,019 | * | 12/1989 | Hoyte et al. ......................... 307/475 |
| 5,047,671 | * | 9/1991 | Suthar et al. ........................ 307/451 |
| 5,214,317 | * | 5/1993 | Nguyen ................................ 307/291 |
| 5,216,297 | * | 6/1993 | Proebsting .......................... 307/475 |
| 5,751,167 | * | 5/1998 | Karube ................................... 326/73 |

\* cited by examiner

Primary Examiner—Michael Tokar
Assistant Examiner—Vibol Tan
(74) Attorney, Agent, or Firm—Foley & Lardner

(57) ABSTRACT

Such a configuration is provided that a clamp circuit and a level shifting circuit are connected to an output of a source-follower circuit connected to a positive power supply, to apply a negative power supply via a transmission line and a terminating resistor to an output end of the level shifting circuit. With this, a CMOS-level logic signal input to the source-follower circuit is shifted in level toward a level of the negative power supply side. In this case, that signal is clamped by the clamp circuit, during which thus level-shifted signal is shifted in level by the level shifting circuit further toward the negative power supply side, thus permitting an ECL-level signal to pass through the transmission line and appear across the terminating resistor in order to be subsequently applied to an ECL logic circuit.

9 Claims, 6 Drawing Sheets

LEVEL CONVERTING METHOD AND CIRCUIT HAVING AN INTERMEDIATE VOLTAGE LEVEL RANGE AND A CLAMPING CIRCUIT

BACKGROUND OF THE INVENTION

1. Field of the Invention

The present invention relates to a level converting method and a level converting circuit and, more particularly, to the level converting method and circuit suitable for converting an output level of a CMOS (Complementary Metal Oxide Semiconductor) logic circuit to an input level of an ECL (Emitter-Coupled Logic) logic circuit.

2. Description of the Related Art

Such a signal transmission system has been so far known that supplies a CMOS logic circuit's output level via a transmission line to an ECL logic circuit. Since the CMOS logic circuit and the ECL logic circuit have mutually different signal levels (hereinafter referred to as logic levels) of their own, to supply a signal output from the CMOS logic circuit via the transmission line to the ECL logic circuit in order to permit that ECL logic circuit to operate predetermined logic operations, it is necessary to convert the logic level of the signal output from the CMOS logic circuit to the logic level of the ECL logic circuit and then supply thus obtained signal to that ECL logic circuit.

In a prior-art example shown in FIG. 4, a CMOS logic circuit 12 which outputs a logic signal to be level-shifted is connected somewhere between a positive power supply $V_{DD}$ (typically 5.0V or 3.3V) and a ground potential, to perform full-swing operations between the $V_{DD}$ and the ground potential when the logic signal is applied to its input. Then, an ECL logic circuit 26 which receives thus level-shifted logic signal is connected somewhere between the ground potential and a negative power supply $V_{EE}$ (typically −5.2V or −4.5V), so that in such a state where a DC (Direct Current) bypass set as a value adapted to perform a logic decision on an input logic signal is applied to its input terminal, it performs logic operations based on the input logic signal at a logic level between the ground potential and the negative power supply $V_{EE}$.

To level-shift the logic level of the logic signal supplied to the ECL logic circuit 26 via a transmission line 22 from the CMOS logic circuit 12 to the logic level of the ECL logic circuit 26 and then apply it to the input of the ECL logic circuit, an input terminal 51 of a source-follower circuit 50 (consisting of an N-channel MOS transistor M50) is connected to an output of the CMOS logic circuit and an output terminal 53 of the source-follower 50 is connected to a sending end of the transmission line 22. A terminating resistor 24 has its one end connected to a receiving end of the transmission line 22 and its other end connected with a negative power supply $V_{TT}$ (typically −2V), so that at both of these ends is generated a DC-logic level (PECL level) with a logic amplitude of 800 milli-volts. This DC-logic level is AC-connected via a capacitor 25 to the input of the CMOS logic circuit 12, thus establishing an interface of the signal level between the CMOS logic circuit 12 performing logic operations on the positive power supply $V_{DD}$ and the ECL logic circuit 26 performing logic operations on the negative power supply; that is, the logic level of a logic signal output from the CMOS logic circuit 12 is level-shifted to a logic level matched to the logic operations of the ECL logic circuit 26.

In contrast to the first prior-art example for transmitting a signal in an AC manner, a second prior-art example shown in FIG. 5 transmits a logic signal to the ECL logic circuit 26 in a DC manner. That is, it is a level-shifting circuit 60 which is interposed, in configuration, between the CMOS logic circuit 12 and the ECL logic circuit 26 having the same configurations as those in the first example, so as to transmit the logic signal having an interfaced signal level to the input of the ECL logic circuit in the DC manner. Note here that this example assumes that the positive power Supply $V_{DD}$ is of 3V and the negative power supply is of −4.5V.

This level shifting circuit 60 includes an open-drain circuit 62, the transmission line 22 which has its sending end connected with an output terminal 63 of the open-drain circuit 62, and resistors R61 and R62 for Thevein-terminating, in configuration, the transmission line 22 between the ground potential at which the transmission line 22 is terminated and the negative power supply $V_{TT}$ (−2V). Thevenin termination here means that a combined resistance of the resistors R61 and R62 is made equal to a characteristic impedance value of the transmission line 22. The terminating end of the level shifting circuit 60 is directly connected to the input of the ECL logic circuit 26. Also, the open-drain circuit 62 consists essentially of an N-channel MOS transistor M62 which has its gate electrode connected with an input terminal 61 connected to the output of the CMOS logic circuit 12 and also its source electrode connected with the negative power supply $V_{TT}$.

Thus, by Thevenin-terminating the transmission line 22 connected to the output of the open-drain circuit 62 between the ground potential and the negative power supply $V_{TT}$ using the resistors R61 and R62, to connect its terminating end directly to the input of the ECL logic circuit 26, thus enabling transmitting a signal to the above-mentioned ECL logic circuit 26 in the DC manner.

A third prior-art example shown in FIG. 6, like the second prior-art example, performs DC-wise transmission to the ECL logic circuit 26. That is, this example is a level shifting circuit which his disposed between the CMOS logic circuit 12 and the ECL logic circuit 26 having almost the same configuration as the first prior-art example, in such a configuration that the logic signal with the interfaced signal level may be transmitted to the input of the ECL logic circuit 26 in the DC manner. Note here that this example assumes that the positive power supply $V_{DD}$ is of 5V and the negative power supply, of −4.5V. This level shifting circuit 70 includes an N-channel MOS type inverter 72 which has its input terminal 71 connected with the output terminal of the CMOS logic circuit 12, a clamp circuit 74 connected to the output terminal of the N-channel MOS type inverter 72, a level shifting circuit 76 connected to the output terminal of the N-channel MOS type inverter 72, a source-follower circuit 78 connected to the output terminal of the level shifting circuit 76, the transmission line 22 which has its sending end connected to an output terminal 79 of the source-follower circuit 78, and a terminating resistor 80 which has its one terminal connected to a receiving end of the transmission line 22 and its other terminal connected to the negative power supply $V_{TT}$ (−2V).

The N-channel MOS type inverter 72 consists essentially of an N-channel MOS type transistor M72 and a resistor R72 in such a configuration that the N-channel MOS type transistor M72 has its gate connected to the input terminal 71, its source connected to the ground (GND), and its drain connected via the resistor R72 to the positive power supply $V_{DD}$. The clamp circuit 74 consists essentially of a PN-junction diode D74 and a resistor R74 in such a configuration that the PN-junction diode D74 has its cathode connected via the resistor R74 to the output terminal of the N-channel MOS type inverter 72. The level shifting circuit 76 consists essentially of an NPN bipolar transistor Q76A, a resistor R76A, an NPN bipolar transistor Q76B, and a resistor R76B which are connected in series between the positive power supply $V_{DD}$ and the negative power supply $V_{EE}$. The base of the NPN bipolar transistor Q76A is connected to the output terminal of the N-channel MOS type inverter 72, while the base of the NPN bipolar transistor Q76B is supplied with a $V_{cs}$ signal. The $V_{cs}$ signal consists essentially of a bias voltage for a constant current source. An NPN bipolar transistor Q78 which constitutes the source-follower circuit 78 has its base connected to the output of the level shifting circuit 76 (connection point between the resistor R76A and the collector of the NPN bipolar transistor Q76B), its collector connected to the ground, and its emitter connected to an output terminal 79 of the source-follower circuit 78. This output terminal 79 of the source-follower circuit 78 is connected to the sending end of the transmission line 22.

Thus, the signal level of a full-swing CMOS signal output from the CMOS logic circuit 12 is converted from the positive power supply $V_{DD}$ side into a signal with an amplitude level of approximately 800 milli-volts at the N-channel MOS type inverter 72 and the clamp circuit 74 and Shifted in level at the level shifting circuit 76 toward the negative power supply $V_{TT}$ and then shifted in level at the source-follower circuit 78 further toward the negative power supply $V_{TT}$ and also converted in impedance, so that a signal output from the source-follower circuit 78 is terminated via the transmission line 22 by the terminating resistor 80 connected to the negative power supply $V_{TT}$. Across the terminating resistor 80 appears a signal level which can be decided by the ECL logic circuit 26, thus enabling DC-wise transmitting of a CMOS signal level to the ECL logic circuit 26.

The above-mentioned first prior-art example, however, has the problem that since the CMOS signal level output from the CMOS logic circuit 12 is level-converted at the level converting circuit 50 and supplied in an AC coupling to the input of the ECL logic circuit 26, the signal transmission is limited to some extent. For example, it may be necessary to scramble a signal to be transferred, that is, to combine a mark and a space such that a signal period of the mark (high level) and the space (low level) of the signal to be transmitted may not be as elongated as a time constant (which is decided by the electrostatic capacitance of the capacitor and the terminating resistance) or it may also be necessary to maintain the mark ratio (a ratio between the mark and the space of a signal to be transmitted) at 50% in an 8B10B encoding method. These measures are taken to prevent impossible logic decision caused by a shift of the signal level applied to the input of the ECL logic circuit 26 toward a bias voltage of the ECL logic circuit 26 in the case where the signal period of same code (for example, logic 0) continues for as long a time as the time constant when AC coupling is provided to the input of the ECL logic circuit 26.

Also, in the above-mentioned second and third prior-art examples, it may be necessary to apply a negative power supply voltage to the level converting circuit in order to provide DC-wise connection. In the case of the third prior-art example, moreover, it is necessary to apply the bias voltage $V_{cs}$ for a constant current source, so that a negative power supply must be equipped for that purpose. In an attempt to install in a mixed manner a level converting circuit as an ASIC (Application Specific IC) output buffer together with a CMOS logic circuit 12, this necessity of applying the negative power supply leads to a problem in power supply distribution that it is necessary to wire a negative power supply bus of the negative power supply in a periphery of the chip for supplying the negative power supply, a problem of inter-power supply ESD (Electro Static Discharge) protection that a reverse-bias ESD protection diode must be interposed between the positive power supply $V_{DD}$ and the negative power supply $V_{TT}$, and a problem of a power supply application sequence that an order must be abided by in which the positive power supply $V_{DD}$ and the negative power supply $V_{TT}$ are applied.

These problems indicate that the level converting circuit of the second or third prior-art example cannot be used as is in a standard ASIC designing method, so that to use it in such a manner, there is no choice other than an approach of solving these problems in doing so. The level converting circuit of the second and third prior-art examples suffers a disadvantage of such a low affinity level that it can be used in the standard ASIC designing method only by taking special countermeasures whereby the above-mentioned problems can be avoided for that designing method.

SUMMARY OF THE INVENTION

In view of the above, it is an object of the present invention to provide a level converting method and a level converting circuit that enables DC-wise connection of an output of a transmission logic circuit to an input of a reception logic circuit with no need of supplying an operating voltage to an inside of a circuit.

According to a first aspect of the present invention, there is provided a level converting method for converting in level a first logic signal output from a first logic circuit and then supplying a second logic circuit with a second logic signal which is different from the first logic signal in voltage level range, the level converting method including the steps of:

in a state in which a first voltage is supplied to an operating voltage supplying end of a first level shifting circuit, supplying a second voltage necessary for outputting the second logic signal to a terminating resistor connected to an output end of a second level shifting circuit, via the terminating resistor to the output end of the second level shifting circuit;

shifting in level the first logic signal output from the first logic circuit to a signal in an intermediate voltage level range which does not reach a voltage level range for the second logic signal;

if, during the level shifting, the second logic signal which corresponds to the signal in the intermediate voltage level range reaches a signal level at which operating performance of the second logic circuit is deteriorated, clamping the signal in the intermediate voltage level range at a predetermined voltage level which is so set as to be less than the signal level; and shifting in level the signal in the intermediate voltage level range which may be clamped during level shifting, to the second logic signal.

Also, according to a second aspect of the present invention, There is provided a level converting circuit which is interposed between a first logic circuit operating on a first logic signal and a second logic circuit operating on a second logic signal which differs from the first logic signal in terms of voltage level range, for converting in level the first logic signal output from the first logic circuit to the second logic signal and then supplying the second logic signal to the second logic circuit, the level converting circuit including:

a first level shifting circuit which has an input end thereof connected to an output end of the first logic circuit, for shifting in level the first logic signal input to the input end from the first logic circuit, to a signal in an intermediate voltage level range which does not reach a voltage level range of the second logic signal and then outputting the signal to an output end thereof;

a clamp circuit connected to an output end of the first level shifting circuit, for clamping, if the second logic signal which corresponds to a signal in the intermediate voltage level range output to the output end reaches such a signal level as to deteriorate operating performance of the second logic circuit, the signal in the intermediate voltage level range to a predetermined voltage level so set as to be less than the signal level, a second level shifting circuit which has an input end thereof connected to the output end of the first level shifting circuit, for shifting in level the signal in the intermediate voltage level range output to the output end, to the second logic signal and then supplying the second logic signal to the output end; and a power supply circuit for supplying a second voltage necessary for outputting the second logic signal at a terminating resistor connected to an output end of the second level shifting circuit, via the terminating resistor to an output end of the second logic circuit.

In the foregoing second aspect, a preferable mode is one wherein the first level shifting circuit has an operating voltage supplying end connected to a positive or negative power supply and the power supply circuit is connected to the negative or positive power supply respectively.

Also, a preferable mode is one wherein the first level shifting circuit has an operating voltage supplying end thereof connected to a positive power supply and the power supply circuit is connected to a negative power supply, in such a configuration that the first level shifting circuit includes a source-follower circuit using an N-channel MOS transistor, the clamp circuit includes a diode-connected N-channel MOS transistor, and the second level shifting circuit includes a diode-connected N-channel MOS transistor.

Also, a preferable mode is one wherein the first level shifting circuit has an operating voltage supplying end thereof connected to a positive power supply and the power supply circuit is connected to a negative power supply, in such a configuration that the first level shifting circuit includes a source-follower-connected N-channel MOS transistor and both the clamp circuit and the second level shifting circuit include a PN-junction diode.

Also, a preferable mode is one wherein the first level shifting circuit has an operating voltage supplying end thereof connected to a positive power supply and the power supply circuit is connected to a negative power supply respectively, in such a configuration that the first level shifting circuit includes an emitter-follower circuit using a bipolar transistor and both the clamp circuit and the second level shifting circuit include a diode-connected bipolar transistor.

Also, a preferable mode is one wherein the power supply circuit includes a transmission line which has a sending end thereof connected to an output end of the second level shifting circuit and a terminating resistor which has one end thereof connected to a reception end of the transmission line and other end thereof connected to a negative power supply.

Also, a preferable mode is one wherein the first level shifting circuit, the clamp circuit, and the second level shifting circuit are integrated on a same semiconductor substrate.

Furthermore, a preferable mode is one wherein the first level shifting circuit, the clamp circuit, and the second level shifting circuit are formed on a same semiconductor substrate using a CMOS manufacturing process.

BRIEF DESCRIPTION OF THE DRAWINGS

The above and other objects, advantages and features of the present invention will be more apparent from a following description taken in conjunction with accompanying drawings in which.

DESCRIPTION OF THE PREFERRED EMBODIMENTS

The following will describe embodiments of the present invention with reference to the accompanying drawings. The description is made specifically using the embodiments.

First Embodiment

Figure 1:
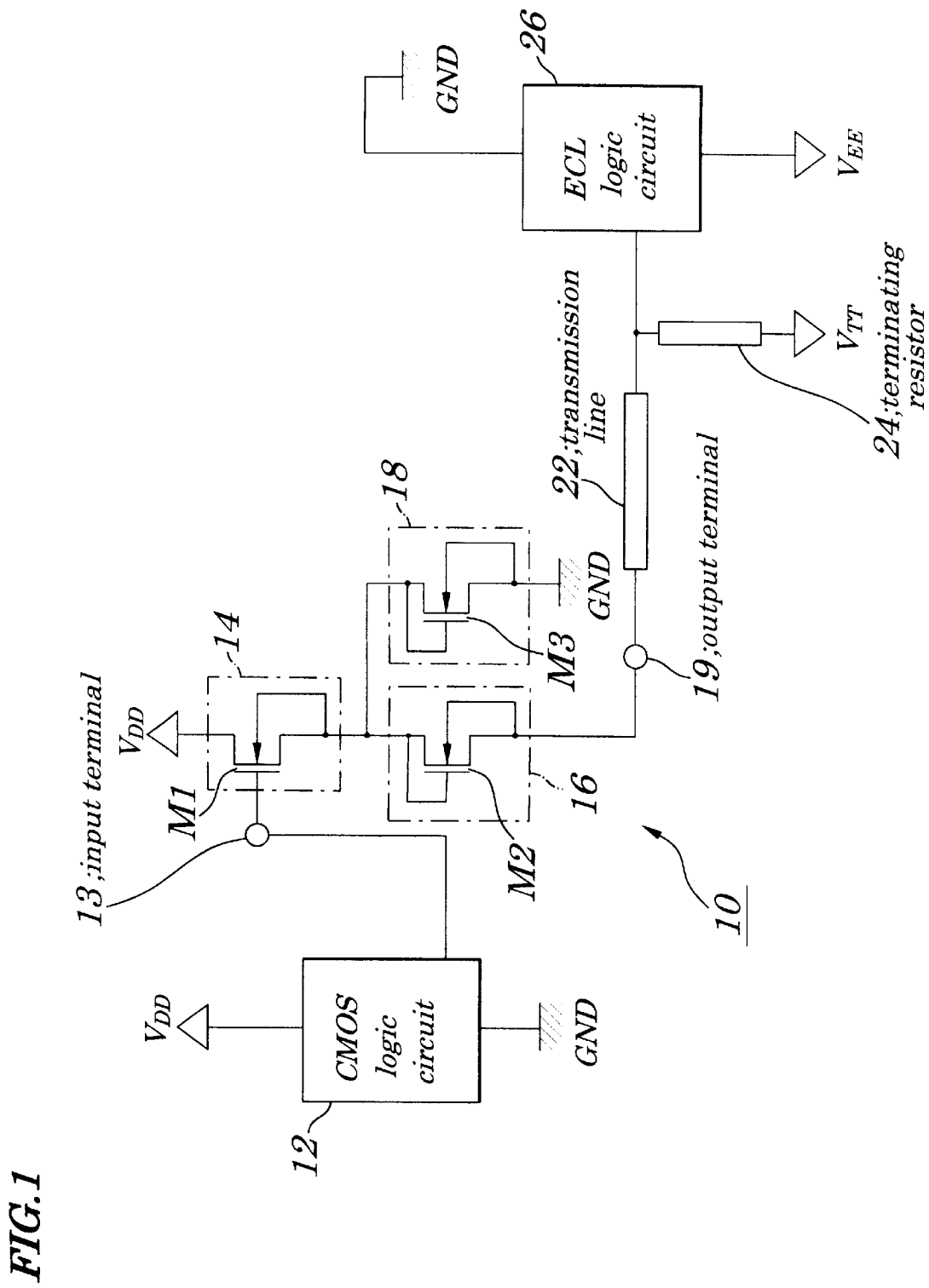
FIG. 1 is a circuit diagram showing a level converting circuit according to a first embodiment of the present invention.

A level converting circuit 10 of this embodiment shown in FIG. 1 converts a CMOS signal level to an ECL signal level without directly applying a negative power supply voltage to within itself, including a source-follower circuit 14, a level shifting circuit 16, a clamp circuit 18, a transmission line 22, and a terminating resistor 24. The source-follower circuit 14 consists essentially of an N-channel MOS transistor M1, having its gate connected via an input terminal 13 to an output terminal of a CMOS logic circuit 12.

The level shifting circuit 16 consists essentially of a diode-connected N-channel MOS transistor M2 with its gate electrode and drain electrode shortcircuited, wherein the drain electrode is connected to the source electrode of the N-channel MOS transistor M1 and the source electrode is connected via an output terminal 19 to the sending end of the transmission line 22. The clamp circuit 18 consists essentially of a diode-connected N-channel MOS transistor M3 with its gate electrode and drain electrode short-circuited, wherein the short-circuited electrodes are connected to the source electrode of the N-channel MOS transistor M1 and the source electrode is connected to ground (GND). The transmission line 22 has its receiving end connected to one end of the terminating resistor 24, an other end of which is connected to the negative power supply $V_{TT}$. A signal which appears across the terminating resistor 24 is applied to the input of an ECL logic circuit 26.

The following will describe operations of the present embodiment with reference to FIG. 1.

A CMOS-level signal output from the CMOS logic circuit 12 is sent to the source-follower circuit 14, which then performs source-follower operations to convert it into a low-impedance CMOS-level signal, which is simultaneously level-shifted from the positive power supply voltage $V_{DD}$ down to a signal lower in voltage than that by as much as its gate-source voltage difference which corresponds to a threshold voltage and a drain current of the N-channel MOS transistor M1. The voltage level of this output voltage signal output from the source-follower circuit 14 is input to the clamp circuit 18 where it is clamped at a constant voltage level which his lower than the ground potential by as much as a value which corresponds to one stage of the diode and, at a same time, input to the level shifting circuit 16 (N-channel MOS transistor M2 acting as a diode) where it is level-shifted to an even lower voltage level. The signal output from the level-shifting circuit 16 passes through the transmission line 22 and appears across the terminating resistor 24, having such a converted signal level (typically −0.9V as a high level and −1.7V as a low level) that is decided by the ECL logic circuit 26.

Thus, with this configuration of the present embodiment, the CMOS-level signal output from the CMOS logic circuit 12 enters the source-follower circuit 14, the output signal of which is then clamped at the constant voltage level at the clamp circuit 18 and, at the same time, level-shifted further at the level shifting circuit 16, the output signal of which subsequently passes through the transmission line 22 and is terminated at the terminating resistor 24 and then applied to the ECL logic circuit 26, so that the terminated signal can be DC-connected to the ECL logic circuit 26.

Therefore, it is unnecessary to perform, on a signal to be transmitted, such processing as scrambling or signal encoding, for example, processing for obtaining a mark ratio of 50% in 8B10B encoding. Therefore, a transmission signal has no restrictions imposed thereon and is free of any redundant signal components, thus eliminating signal overheads.

Also, since the above-mentioned configuration is designed to supply the negative power supply $V_{TT}$ voltage via the terminating resistor 24 to the active element of the level converting circuit 10, such problems can be eliminated as power supply distribution, ESD protection between power supplies, and power application sequence observance, which are required for a configuration of directly applying a negative power supply voltage to the level converting circuit, to provide easy adaptability and high affinity to a standard ASIC designing method used for gate arrays, thus enabling installing a variety of circuits, in a mixed manner, together with the CMOS logic circuit 12 used as an ASIC output buffer.

Moreover, since the clamp circuit 18 has a clamping action on an output of the source-follower circuit 14, it is possible to prevent irregularities in manufacturing from lowering the threshold voltage of the N-channel MOS transistor M1 and also fluctuations in the $V_{DD}$, temperature, and other service environment conditions from excessively raising its high-level output, so that the bipolar transistor constituting the input buffer of the ECL logic circuit 26 can be prevented from entering its saturation region, in which its operating speed is lowered.

Second Embodiment

Figure 2:
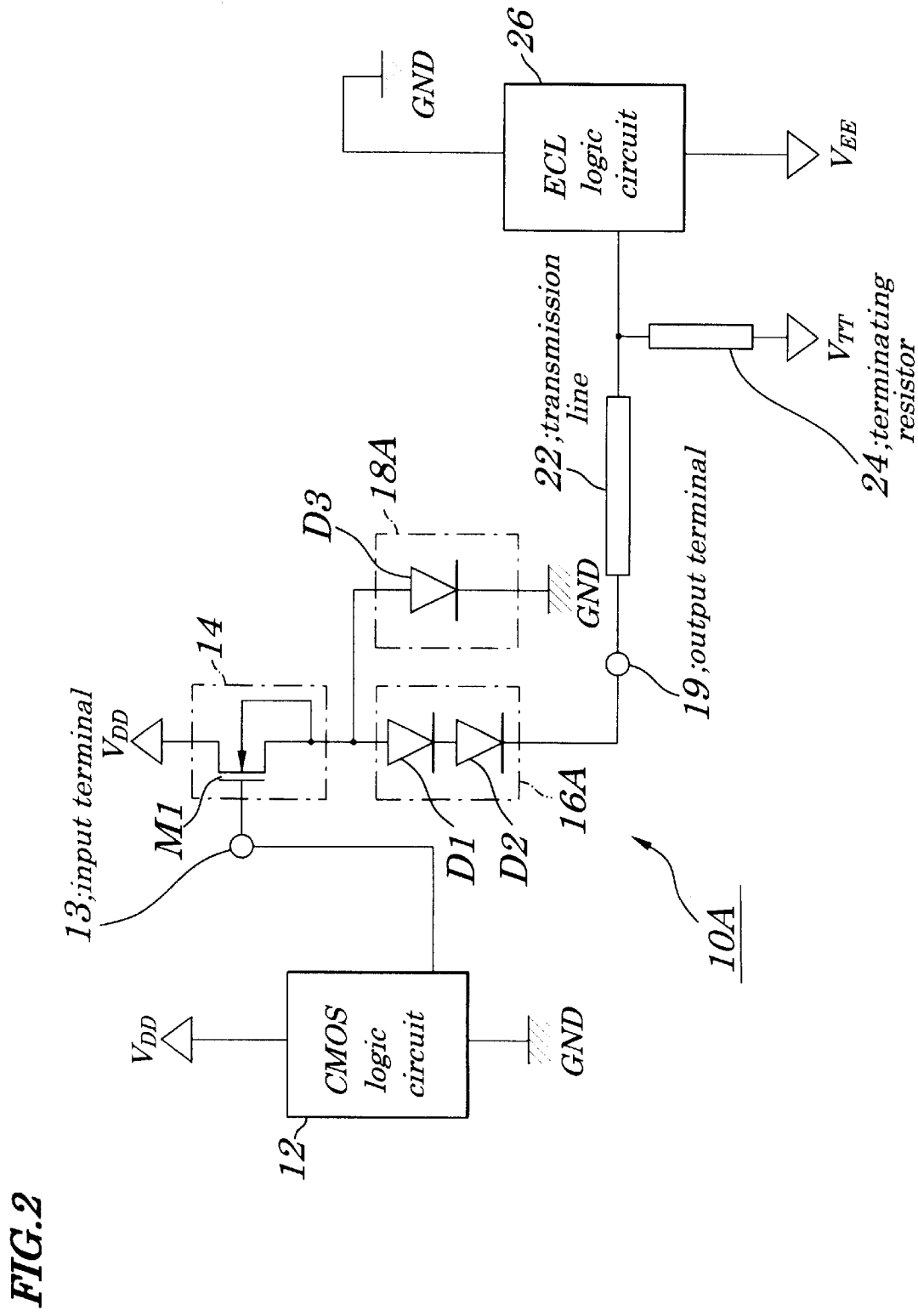
FIG. 2 is a circuit diagram showing a level converting circuit according to a second embodiment of the present invention.

A configuration of a second embodiment shown in FIG. 2 largely differs from that of the first embodiment in a respect that the level shifting circuit 16 and the clamp circuit 18 of the first embodiment consist essentially of diodes. That is, a level shifting circuit 16A of the present embodiment consists essentially of two diodes connected in series and a clamp circuit 18A, one diode.

Note here that since, except for the above-mentioned difference, the configuration of the present embodiment is the same as that of the first embodiment, further description is omitted here, because the same reference numerals indicate the same components in FIGS. 1 and 2.

The following will describe operations of the present embodiment with reference to FIG. 2.

Like in the case of the first embodiment, the CMOS-level signal output from the CMOS logic circuit 12 is converted at the source-follower circuit 14 down to the low-impedance CMOS-level signal and level-shifted from the positive power supply voltage $V_{DD}$ down to a voltage as much as a threshold voltage of the N-channel MOS transistor M1 and a gate-source voltage corresponding to a drain current.

The voltage level output from the source-follower circuit 14 is then clamped by the clamp circuit 18a at a voltage (typically −0.8V approximately) different from a ground potential by a value corresponding to one stage of a diode and, at a same time, level-shifted by the level shifting circuit 16A (consisting of diodes D1 and D2) to a voltage level (typically 1.6V approximately) lower than the ground potential by as much as a value corresponding to two stages of the diodes D1 and D2.

The signal output from the level shifting circuit 16A passes through the transmission line 22 and appears across the terminating resistor 24, having such a converted signal level (typically −0.9V as a high level and −1.7V as a lower level) that can be decided by the ECL logic circuit 26.

Thus, with this configuration of the present invention, the CMOS-level signal output from the CMOS logic circuit 12 enters the source-follower circuit 14, the output signal of which is then clamped at the constant voltage level at the clamp circuit 18 and, at the same time, level-shifted further at the level shifting circuit 16, the output signal of which subsequently passes through the transmission line 22 and is terminated at the terminating resistor 24 and then applied to the ECL logic circuit 26, so that the terminated signal can be DC-connected to the ECL logic circuit 26.

Therefore, it is unnecessary to perform, on the signal to be transmitted, such processing as scrambling or signal encoding, for example, processing for obtaining a mark ratio of 50% in 8B10B encoding.

Therefore, the transmission signal has no restrictions imposed thereon and is free of any redundant signal components, thus eliminating signal overheads.

Also, since the above-mentioned configuration is designed to supply the negative power supply $V_{TT}$ voltage via the terminating resistor 24 to the active element of the level converting circuit 10A, such problems can be eliminated as power supply distribution, ESD protection between power supplies, and power application sequence observance, which are required for a configuration of directly applying a negative power supply voltage to the level converting circuit, to provide easy adaptability and high affinity to a standard ASIC designing method used for gate arrays, thus enabling installing a variety of circuits in a mixed manner together with the CMOS logic circuit 12 used as an ASIC output buffer.

Moreover, since the clamp circuit 18A has a clamping action on an output of the source-follower circuit 14, it is possible to prevent irregularities in manufacturing from lowering the threshold voltage of the N-channel MOS transistor M1 and also fluctuations in the $V_{DD}$, temperature, and other service environment conditions from excessively raising its high-level output, so that the bipolar transistor constituting the input buffer of the ECL logic circuit 26 can be prevented from entering its saturation region, in which its operating speed is lowered.

Third Embodiment

This configuration of a third embodiment differs largely from that of the first embodiment in a respect that both the level shifting circuit 16 and the clamp circuit 18 of the third embodiment consist essentially of bipolar transistors. That is, a level converting circuit 10B includes an emitter-follower circuit 14B, a level shifting circuit 16B, and a clamp circuit 18B. The emitter-follower circuit 14B consists essentially of an NPN bipolar transistor Q1. The level shifting circuit 16B consists essentially of four NPN bipolar transistors Q21, Q22, Q23, and Q24 which are connected in series and also each of which has its base and collector short circuited. The clamp circuit 18B consists essentially of one NPN bipolar transistor Q3 with its base and collector short-circuited in such a configuration that the short-circuited point is connected to an interconnection point between the NPN bipolar transistors Q22 and Q23 of the level shifting circuit 16B and the emitter, to a ground (GND).

Figure 3:
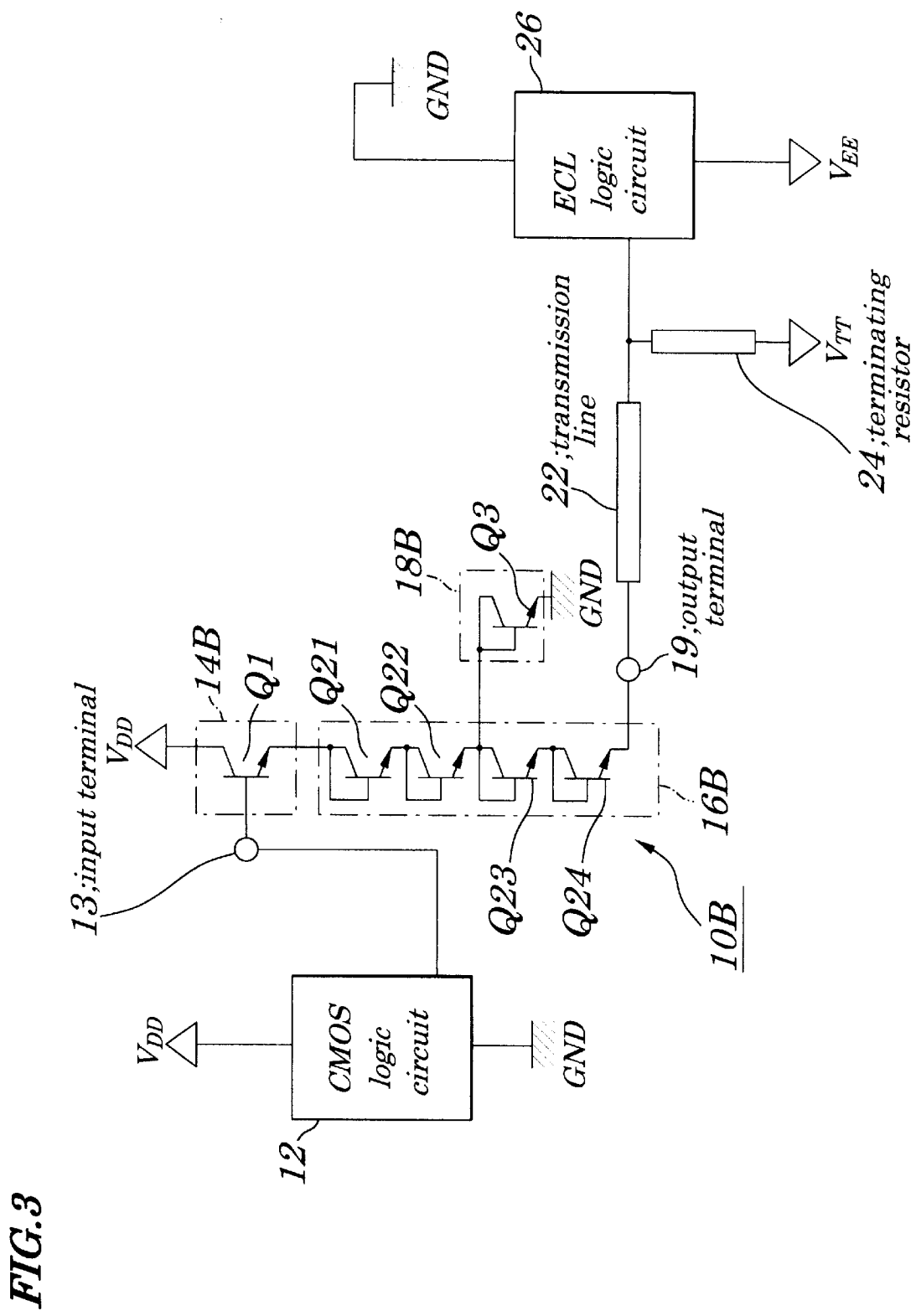
FIG. 3 is a circuit diagram showing a level converting circuit according to a third embodiment of the present invention.
Figure 4:
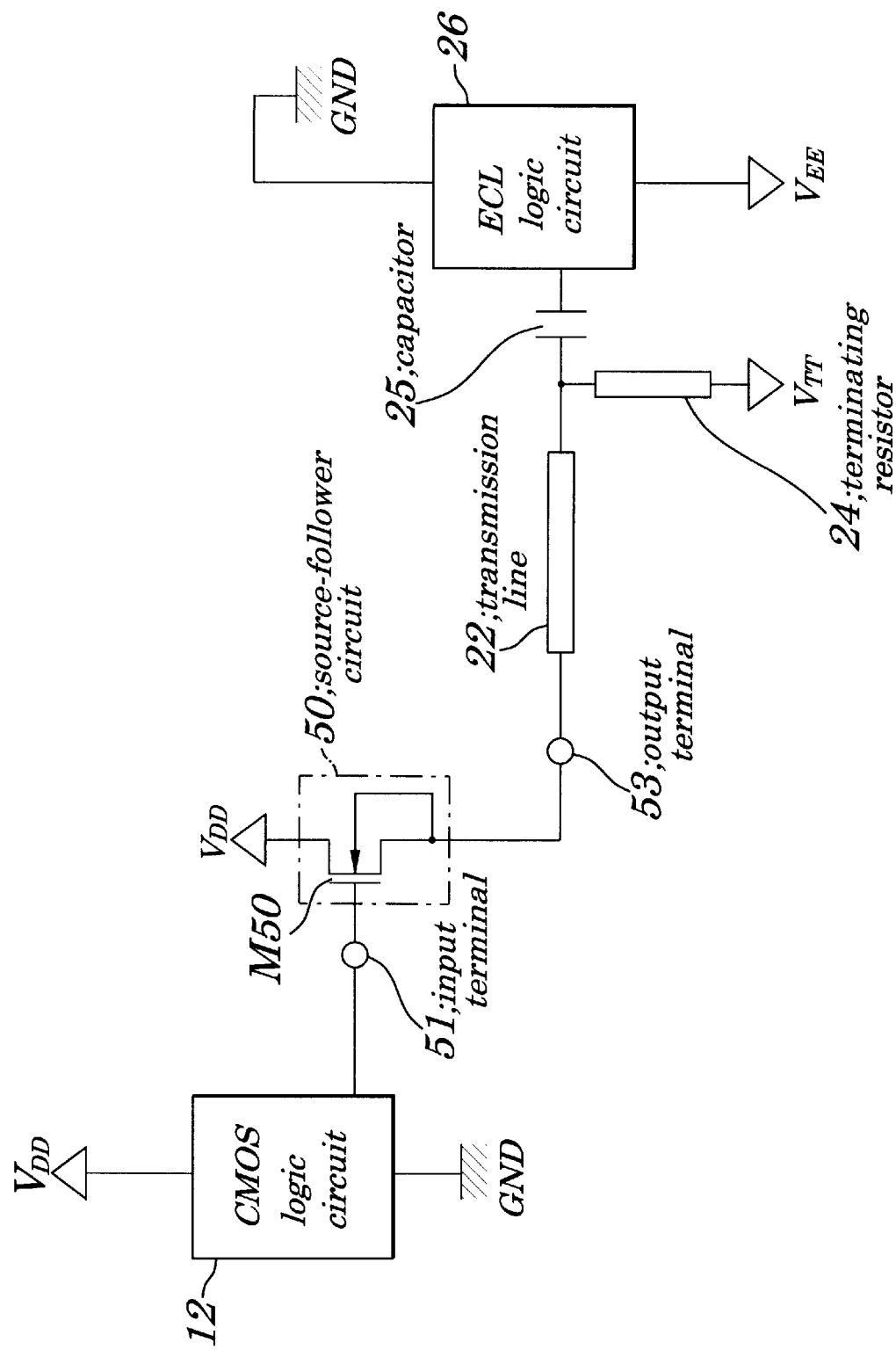
FIG. 4 is a circuit diagram showing a first example of a prior-art level converting circuit.
Figure 5:
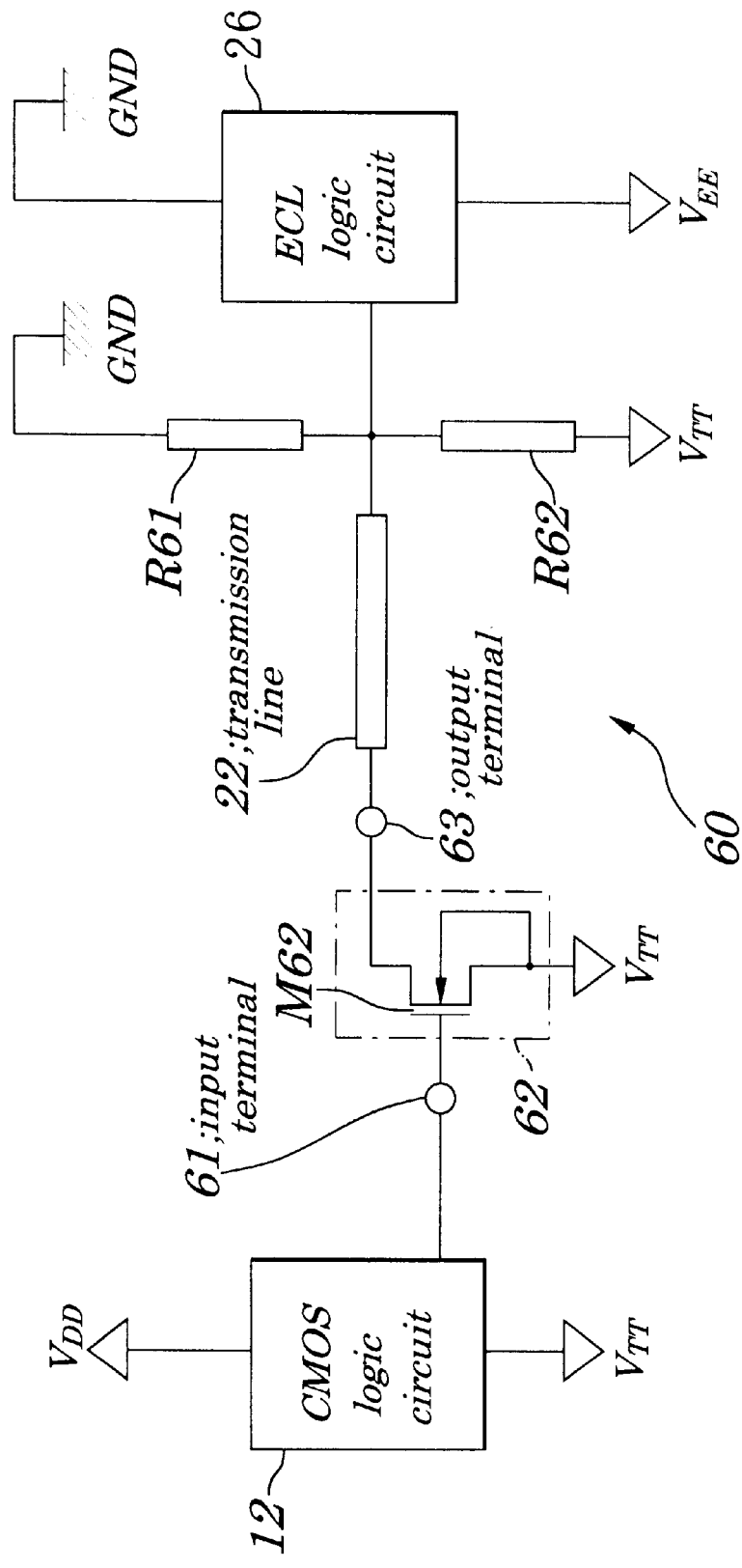
FIG. 5 is a circuit diagram showing a second example of the prior-art level converting circuit.
Figure 6:
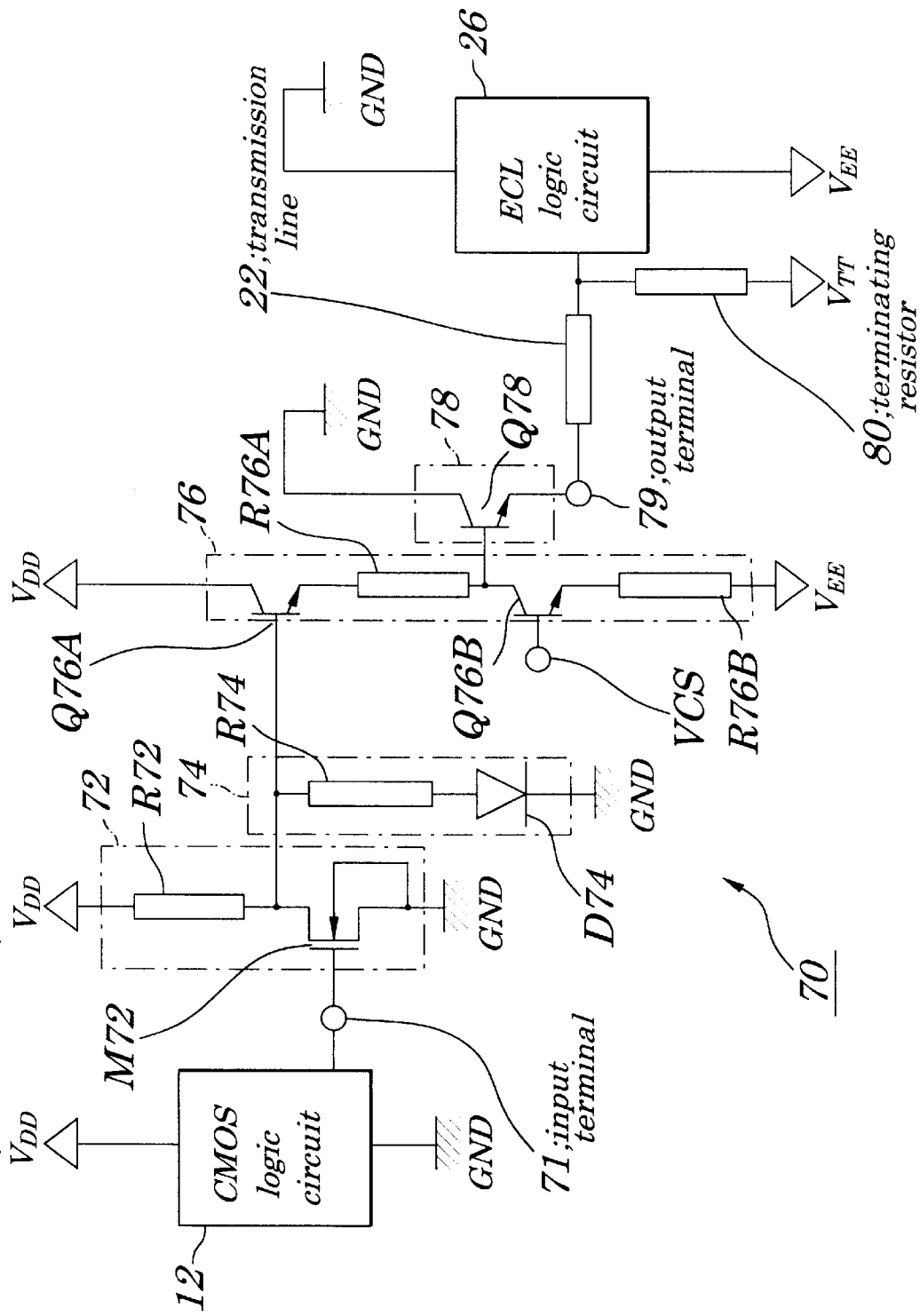
FIG. 6 is a circuit diagram showing a third example of the prior-art level converting circuit.

The following will describe operations of the present embodiment with reference to FIG. 3.

A CMOS-level signal output from the CMOS logic circuit 12 is converted at the emitter-follower circuit 14B to a low-impedance CMOS-level signal, which is in turn level-shifted to a voltage lower than a positive power supply voltage $V_{DD}$ by as much as a base-emitter voltage which corresponds to a turnon current of the NPN bipolar transistor Q1.

Then, the signal output from the emitter-follower circuit 14B is, in voltage level, clamped by the clamp circuit 18B at a voltage (typically −0.8V approximately) and, at a same time, level-shifted by the level shifting circuit 16B (through four diode-connected NPN bipolar transistors Q21, Q22, Q23, and Q24) down to a lower voltage level by as much as a value (typically 3.2V approximately) which corresponds to the four stages of the diodes.

The signal output from the level shifting circuit 16B passes through a transmission line 22 and appears across a terminating resistor 24, having such a converted signal level (typically −0.9V as a high level and −1.7V as a low level) that can be decided by an ECL logic circuit 26.

Thus, with this configuration of the present embodiment, the CMOS-level signal output from the CMOS logic circuit 12 enters the emitter-follower circuit 14B, the output signal of which is then clamped at the constant voltage value by the clamp circuit 18 and, at the same time, level-shifted further by the level shifting circuit 16B, the output signal of which subsequently passes through the transmission line 22 and is terminated at the terminating resistor 24 and then applied to the ECL logic circuit 26, so that the terminated signal can be DC-connected to the ECL logic circuit 26.

Therefore, it is unnecessary to perform, on a signal to be transmitted, such processing as scrambling or signal encoding, for example, processing for obtaining a mark ratio of 50% in 8B10B encoding. Therefore, a transmission signal has no restrictions imposed thereon and is free of any redundant signal components, thus eliminating signal overheads.

Also, since the above-mentioned configuration is designed to supply a negative power supply $V_{TT}$ voltage via the terminating resistor 24 to the active element of the level converting circuit 10B, such problems can be eliminated as power supply distribution, ESD protection between power supplies, and power application sequence observance, which are required for a configuration of directly applying the negative power supply $V_{TT}$ voltage to the level converting circuit, to provide easy adaptability and high affinity to a standard ASIC designing method used for gate arrays, thus enabling installing a variety of circuits, in a mixed manner, together with the CMOS logic circuit 12 used as an ASIC output buffer.

Moreover, since the clamp circuit 18B has a clamping action on a signal output from the NPN bipolar transistor Q2 in the level shifting circuit 16B, it is possible to prevent a high level voltage appearing at the NPN bipolar transistor Q24 of the level shifting circuit 16B from rising above a voltage (typically −0.8V) lower than the ground potential by as much as a value which corresponds to one stage of the diode, so that the bipolar transistor constituting the input buffer of the ECL logic circuit 26 can be prevented from entering its saturation region, in which its operating speed is lowered.

It is apparent that the present invention is not limited to the above embodiments but may be changed and modified without departing from the scope and spirit of the invention.

For example, although in the first through third embodiments, the level converting circuit is interposed between the CMOS logic circuit and the ECL logic circuit, the level converting circuit shown in any of the embodiments may be placed between a TTL (Transistor Transistor Logic) logic circuit and a GaAs (Gallium Arsenide) logic circuit or between the CMOS logic circuit and the GaAs logic circuit. Also, it may be disposed between the TTL logic circuit and the GaAs logic circuit.

Also, including the above-mentioned modifications, when a spacing is small between the transmission logic circuit for transmitting a logic signal and the reception logic circuit for receiving that signal, one end of the terminating resistor may be connected, in configuration, to the output end of the transmission logic circuit and the other end, to the negative power supply $V_{TT}$, without using the transmission line 22.

Further also, in the first and second embodiments, the N-channel MOS transistor may be replaced by a bipolar transistor. In the third embodiment, also, the bipolar transistor may be replaced by a uni-polar transistor. Further, the number of transistors of the level shifting circuits 16, 16B, and 16B may differ from that of the above-mentioned embodiments.

Even further, in any of the above-mentioned embodiments and modifications, the ground potential for the logic circuits may be a different potential (voltage) in configuration of the respective level converting circuits.

As described above, with a configuration of the present invention, DC connection is possible from the output of the transmission logic circuit to the input of the reception logic circuit without supplying an operating voltage to the inside of the circuit. In that DC connection, such problems can be eliminated as power supply distribution, ESD protection between the power supplies, and power application sequence observance, which are required for a configuration of directly applying an operating voltage to the inside of the level converting circuit, to provide high affinity with a standard ASIC designing method, thus enabling installing CMOS logic circuits. and ECL logic circuits in a mixed manner. With DC connection, also, special signal processing is rendered unnecessary for avoiding disability in logic decision by the ECL logic circuit.

It is also possible with the clamp circuit to prevent the operating performance of a signal level input to the ECL logic circuit from lowering, thus preventing the transistor from operating at its saturation region.

Finally, the present application claims the priority of Japanese Patent Application No. Hei11-140858 filed on May 20, 1999, which is herein incorporated by reference.

What is claimed is:

1. A level converting method for converting in level a first logic signal output from a first logic circuit and then supplying a second logic circuit with a second logic signal which is different from said first logic signal in voltage level range, said level converting method comprising the steps of;

in a state in which a first voltage is supplied to an operating voltage supplying end of a first level shifting circuit, supplying a second voltage necessary for outputting said second logic signal to a terminating resistor connected to an output end of a second level shifting circuit, via said terminating resistor to said output end of said second level shifting circuit;

shifting in level said first logic signal output from said first logic circuit to a signal in an intermediate voltage level range which does not reach a voltage level range for said second logic signal;

if, during said level shifting, said second logic signal which corresponds to said signal in said intermediate voltage level range reaches a signal level at which operating performance of said second logic circuit is deteriorated, clamping said signal in said intermediate voltage level range at a predetermined voltage level which is so set as to be less than said signal level; and shifting in level said signal in said intermediate voltage level range which may be clamped during level shifting, to said second logic signal.

2. A level converting circuit which is interposed between a first logic circuit operating on a first logic signal and a second logic circuit operating on a second logic signal which differs from said first logic signal in terms of voltage level range, for converting in level said first logic signal output from said first logic circuit to said second logic signal and then supplying said second logic signal to said second logic circuit, said level converting circuit comprising:

a first level shifting circuit which has an input end thereof connected to an output end of said first logic circuit, for shifting in level a first logic signal input to said input end from said first logic circuit, to a signal in an intermediate voltage level range which does not reach a voltage level range of said second logic signal and then outputting said signal to an output end thereof;

a clamp circuit connected to an output end of said first level shifting circuit, for clamping, if said second logic signal which corresponds to a signal in said intermediate voltage level range output to said output end reaches such a signal level as to deteriorate operating performance of said second logic circuit, said signal in said intermediate voltage level range to a predetermined voltage level so set as to be less than said signal level, a second level shifting circuit which has an input end thereof connected to said output end of said first level shifting circuit, for shifting in level said signal in said intermediate voltage level range output to said output end, to said second logic signal and then supplying said second logic signal to said output end; and a power supply circuit for supplying a second voltage necessary for outputting said second logic signal at a terminating resistor connected to an output end of said second level shifting circuit, via said terminating resistor to an output end of said second logic circuit.

3. The level converting circuit according to claim 2, wherein said first level shifting circuit has an operating voltage supplying end connected to a positive or negative power supply and said power supply circuit is connected to said negative or positive power supply respectively.

4. The level converting circuit according to claim 2, wherein said first level shifting circuit has an operating voltage supplying end thereof connected to a positive power supply and said power supply circuit is connected to a negative power supply, in such a configuration that said first level shifting circuit comprises a source-follower circuit using an N-channel MOS transistor, said clamp circuit comprises a diode-connected N-channel MOS transistor, and said second level shifting circuit comprises a diode-connected N-channel MOS transistor.

5. The level converting circuit according to claim 2, wherein said first level shifting circuit has an operating voltage supplying end thereof connected to a positive power supply and said power supply circuit is connected to a negative power supply, in such a configuration that said first level shifting circuit comprises a source-follower-connected N-channel MOS transistor and both said clamp circuit and said second level shifting circuit comprise a PN-junction diode.

6. The level converting circuit according to claim 2, wherein said first level shifting circuit has an operating voltage supplying end thereof connected to a positive power supply and said power supply circuit is connected to a negative power supply respectively, in such a configuration that said first level shifting circuit comprises an emitter-follower circuit using a bipolar transistor and both said clamp circuit and said second level shifting circuit comprise a diode-connected bipolar transistor.

7. The level converting circuit according to claim 2, wherein said power supply circuit comprises a transmission line which has a sending end thereof connected to an output end of said second level shifting circuit and a terminating resistor which has one end thereof connected to a reception end of said transmission line and other end thereof connected to a negative power supply.

8. The level converting circuit according to claim 4, wherein said first level shifting circuit, said clamp circuit, and said second level shifting circuit are integrated on a same semiconductor substrate.

9. The level converting circuit according to claim 4, wherein said first level shifting circuit, said clamp circuit, and said second level shifting circuit are formed on a same semiconductor substrate using a CMOS manufacturing process.

* * * * *